US009897999B2

(12) United States Patent
Asakura et al.

(10) Patent No.: US 9,897,999 B2
(45) Date of Patent: Feb. 20, 2018

(54) SETTING OPERATION CONTROL IN PARTS MOUNTING DEVICE BY REDUCING A VARIATION OF A DISTANCE VALUE

(71) Applicant: YAMAHA HATSUDOKI KABUSHIKI KAISHA, Shizuoka (JP)

(72) Inventors: Ryoji Asakura, Tokyo (JP); Kenji Tamaki, Tokyo (JP); Masahiro Hoshino, Kumagaya (JP); Hiroto Sekiguchi, Kumagaya (JP); Tomise Koyama, Kumagaya (JP)

(73) Assignee: YAMAHA HATSUDOKI KABUSHIKI KAISHA, Shizuoka-ken (JP)

( * ) Notice: Subject to any disclaimer, the term of this patent is extended or adjusted under 35 U.S.C. 154(b) by 762 days.

(21) Appl. No.: 14/389,690

(22) PCT Filed: Jan. 9, 2013

(86) PCT No.: PCT/JP2013/050191
§ 371 (c)(1),
(2) Date: Dec. 1, 2014

(87) PCT Pub. No.: WO2013/132879
PCT Pub. Date: Sep. 12, 2013

(65) Prior Publication Data
US 2015/0081079 A1   Mar. 19, 2015

(30) Foreign Application Priority Data

Mar. 7, 2012  (JP) ................................ 2012-049915

(51) Int. Cl.
*G05B 19/408* (2006.01)
*G05B 19/402* (2006.01)
(Continued)

(52) U.S. Cl.
CPC ....... *G05B 19/4083* (2013.01); *G05B 19/402* (2013.01); *H05K 13/08* (2013.01);
(Continued)

(58) Field of Classification Search
None
See application file for complete search history.

(56) References Cited

U.S. PATENT DOCUMENTS 5,489,168 A  *  2/1996  Sheldon .............. B23Q 1/5462
                                                248/631
5,570,993 A     11/1996  Onodera et al.
(Continued)

FOREIGN PATENT DOCUMENTS

| CN | 1893811 A   | 1/2007 |
| CN | 101209007 A | 6/2008 |

(Continued)

OTHER PUBLICATIONS

International Search Report issued in International Application No. PCT/JP2013/050191 dated Feb. 12, 2013.
(Continued)

*Primary Examiner* — Eric C Wai
(74) *Attorney, Agent, or Firm* — Studebaker & Brackett PC

(57) ABSTRACT

A technology is provided to enable lowering the fault generation rate related to a parts installation device. A parts installation device (100) (calculation device (150)) fetches or calculates state parameter values that represent the relative position relationship or the distance of a part holder and a part during the operation of removing and holding, calculates the fluctuation values of the state parameters, and corrects parameters having a small increase in the cycle time and is effective in reducing fluctuations among the parameter values of the holding position of the part holder, stop (Continued)

time, operating speed, and operation acceleration when the value of the fluctuations exceeds a first threshold.

15 Claims, 13 Drawing Sheets

(51) Int. Cl.
   *H05K 13/08* (2006.01)
   *G06F 19/00* (2011.01)
(52) U.S. Cl.
   CPC .............. *G05B 2219/36195* (2013.01); *G05B 2219/45055* (2013.01)

(56) References Cited

U.S. PATENT DOCUMENTS

| | | | |
|---|---|---|---|
| 6,766,283 B1 * | 7/2004 | Goldman | ......... G05B 19/41875 700/108 |
| 7,739,077 B2 | 6/2010 | Maenishi | |
| 2009/0008299 A1 | 1/2009 | Conger et al. | |
| 2009/0082998 A1 | 3/2009 | Maenishi | |

FOREIGN PATENT DOCUMENTS

| | | |
|---|---|---|
| JP | 05-175691 A | 7/1993 |
| JP | 06-104596 A | 4/1994 |
| JP | 2005-150158 A | 6/2005 |
| JP | 2010-073929 A | 4/2010 |
| JP | 4607820 B2 | 1/2011 |

OTHER PUBLICATIONS

The First Office Action issued by the Chinese Patent Office dated Mar. 2, 2016, which corresponds to Chinese Patent Application No. 201380023748.7 and is related to U.S. Appl. No. 14/389,690; with English language abstract.

* cited by examiner

FIG. 10

D1: ATTACHMENT INFORMATION

| ORDER | PART ATTACHMENT POSITION COORDINATE | FEEDER NUMBER | ADSORPTION NOZZLE NUMBER |
|---|---|---|---|
| 1 | (15.4, 19.2) | 1 | 1 |
| 2 | (13.2, 11.4) | 1 | 2 |
| 3 | (12.1, 9.0) | 1 | 1 |
| ... | ... | ... | ... |
| 100 | (12.1, 10.4) | 7 | 2 |

FIG. 11

D2: OPERATION INFORMATION

| FEEDER NUMBER | ADSORPTION NOZZLE NUMBER | STOP POSITION (Z) | STOP TIME (T) | OPERATION VELOCITY (VZ) |
|---|---|---|---|---|
| 1 | 1 | 0.5 | 1 | 1.0 |
| 1 | 2 | 0.6 | 1 | 1.0 |
| 2 | 2 | 0.6 | 2 | 0.9 |
| 3 | 7 | 0.6 | 2 | 1.0 |
| ... | ... | ... | ... | ... |

FIG. 12

D3: ADSORPTION RESULT INFORMATION

| FEEDER NUMBER | ADSORPTION NOZZLE NUMBER | STOP POSITION (Z) | STOP TIME (T) | OPERATION VELOCITY (VZ) | PART HOLDING POSITION HX | PART HOLDING POSITION HY | DISTANCE KZ |
|---|---|---|---|---|---|---|---|
| 12a | 12b | 12c | 12d | 12e | 12f | 12g | 12h |
| 1 | 1 | 0.5 | 1 | 1.0 | 0.1 | 0.1 | 1.1 |
| 1 | 2 | 0.6 | 1 | 1.0 | 0.0 | 0.0 | 1.2 |
| 1 | 1 | 0.5 | 1 | 1.0 | 0.3 | −0.2 | 1.1 |
| ... | ... | ... | ... | ... | ... | ... | ... |
| 1 | 1 | 0.5 | 1 | 1.0 | −0.3 | 0.3 | 1.1 |
| 1 | 2 | 0.6 | 1 | 1.0 | 0.0 | 0.1 | 1.2 |
| 1 | 1 | 0.5 | 1 | 1.0 | −0.1 | 0.2 | 1.1 |
| ... | ... | ... | ... | ... | ... | ... | ... |

FIG. 13

D4: VARIATION INFORMATION

| FEEDER NUMBER (13a) | ADSORPTION NOZZLE NUMBER (13b) | PRE-MODIFICATION | | |
|---|---|---|---|---|
| | | PART HOLDING POSITION (HX, HY) VARIANCE VarXY(B) (13c) | DISTANCE (KZ) VARIANCE VarZ(B) (13d) | THE NUMBER OF DATA M(B) (13e) |
| 1 | 1 | 0.11 | 0.01 | 22 |

| POST-MODIFICATION | | |
|---|---|---|
| PART HOLDING POSITION (HX, HY) VARIANCE VarXY(A) (13f) | DISTANCE (KZ) VARIANCE VarZ(A) (13g) | THE NUMBER OF DATA M(A) (13h) |
| 0.03 | 0.01 | 20 |

FIG. 14

D5: THRESHOLD INFORMATION

| EXECUTION DETERMINATION THRESHOLD Th1 (14a) | EFFECT DETERMINATION THRESHOLD (NUMBER OF DATA 20) ThE20 (14b) | EFFECT DETERMINATION THRESHOLD (NUMBER OF DATA 40) ThE40 (14c) | EFFECT DETERMINATION THRESHOLD (NUMBER OF DATA 60) ThE60 (14d) |
|---|---|---|---|
| 0.1 | 2.12 | 1.99 | 1.95 |

FIG. 15

D6: REDUCTION EFFECT INFORMATION

| STOP POSITION (Z) EFFECT (15a) | STOP TIME (T) EFFECT (15b) | OPERATION VELOCITY (VZ) EFFECT (15c) |
|---|---|---|
| × | — | ○ |

FIG. 16

D7: CYCLE CHANGE QUANTITY INFORMATION

| STOP POSITION (Z) CYCLE CHANGE QUANTITY (16a) | STOP TIME (T) CYCLE CHANGE QUANTITY (16b) | OPERATION VELOCITY (VZ) CYCLE CHANGE QUANTITY (16c) |
|---|---|---|
| 0.01 | 0.50 | 0.35 |

US 9,897,999 B2

SETTING OPERATION CONTROL IN PARTS MOUNTING DEVICE BY REDUCING A VARIATION OF A DISTANCE VALUE

INCORPORATION BY REFERENCE

This application is the U.S. National Phase under 35 U.S.C. § 371 of International Application No. PCT/JP2013/050191, filed on Jan. 9, 2013, which in turn claims the benefit of priority from prior Japanese Patent Application No. 2012-049915, filed on Mar. 7, 2012, the entire contents of which are incorporated herein by reference.

TECHNICAL FIELD

The present invention relates to a technique of a device (parts mounting device) for mounting parts (electronic parts) on a substrate (circuit board) required for production of electronic devices. In particular, the present invention relates to a technique of conducting arithmetic operation (information processing) to calculate, determine and modify parameter values in operation control setting of regions (a head, a part holding member, or the like) of a parts mounting device.

BACKGROUND ART

A parts mounting device adsorbs a part held by a parts supply device (feeder) with an internally depressurized adsorption nozzle (hereafter referred to as "nozzle" as well), conveys the part to a predetermined position on a substrate, and attaches the part to the substrate (hereafter, adsorption and attachment are collectively referred to as mounting). As regards the parts mounting device, directions crossing a gravitation direction (inclusive of obliquely) are supposed to be X and Y directions (X-Y plane) and a direction crossing the X and Y directions (X-Y plane) perpendicularly is supposed to be a Z direction. At the time of the attaching operation in this case, the parts mounting device moves a nozzle to a position (a predetermined X, Y and Z position) in the vicinity of a part (adsorption target) held by a feeder by moving the nozzle (a head or the like having the nozzle) in the X and Y direction and Z direction, adsorbs the part by stopping the nozzle for a predetermined time and depressurizing inside of the nozzle, and attaches the part onto a predetermined position of a substrate by moving the nozzle adsorbing the part in the X and Y direction and the Z direction at predetermined operation velocity.

There is JP-B-4607820 (Patent Literature 1). In Patent Literature 1, a method of increasing the stop time of the adsorption nozzle in a case where an occurrence rate of abnormalities at the time of part adsorption has increased is stated.

CITATION LIST

Patent Literature

PATENT LITERATURE 1. JP-B-4607820

SUMMARY OF INVENTION

Technical Problem

In the parts mounting device as described above, it is necessary to suitably set the position of the nozzle at the time of adsorption, the stop time of the nozzle at the time of adsorption, the operation velocity of the nozzle after the adsorption, and the like, in accordance with the position of the part mounted on and held by the feeder, and the shape, weight and the like of the part.

For example, in a case where the mounting position of the part deviates to a position on an opposite side as compared with the nozzle stop position in the Z direction (a little above the part), (for example, in a case where the feeder (concave portion) mounting the part deviates a little below in the Z direction), the distance between the part and the nozzle becomes large and it becomes difficult to adsorb the part to the nozzle suitably (FIG. 5). As a result, an adsorption abnormality in which the part is adsorbed in an inclined state, or an adsorption abnormality in which the part cannot be adsorbed occurs. In such a case, it is necessary to, for example, move the adsorption position (stop position) of the nozzle to a position closer to the part in the Z direction.

Furthermore, for example, in a case where a pressure control mechanism concerning the nozzle is degraded, it takes a longer time until the inside of the nozzle is depressurized. As a result, the nozzle operates in a state in which the inside of the nozzle is not sufficiently depressurized. Accordingly, an adsorption abnormality in which the part is adsorbed in an inclined state, or an adsorption abnormality in which the part cannot be adsorbed occurs. In such a case, it becomes necessary to, for example, increase the stop time of the nozzle at the time of part adsorption to sufficiently depressurize the inside of the nozzle, or lower the operation velocity (the velocity of the nozzle, the head or the like) or operation acceleration according to the depressurization situation within the nozzle.

For lowering the occurrence rate of abnormalities as described above, it becomes necessary to calculate the position at the time when the nozzle adsorbs the part, the stop time, the operation velocity, the operation acceleration, and the like by means of, for example, arithmetic operation and set (modify) them suitably.

The prior art example has two problems described hereafter. In the technique in Patent Literature 1, parameters are changed after an adsorption abnormality has occurred and consequently it is not possible to prevent a part abnormality. Furthermore, when an adsorption abnormality has occurred, only the stop time of the nozzle at the time of part adsorption among a plurality of changeable parameters is changed. Even in a case where, for example, an adsorption abnormality can be prevented by changing the stop position of the nozzle and an increase of time required for production (cycle time) in a case where the stop position of the nozzle is changed is smaller as compared with a case where the stop time of the nozzle is changed, therefore, the stop time is increased. In this case, the quantity of production is lowered by the increase of the cycle time.

In view of the circumstances described heretofore, a main object (subject) of the present invention is to provide a technique capable of preventing the occurrence of an abnormality in parts mounting devices by suitably calculating, determining and modifying the position of a part holding member in directions including the Z direction at the time when adsorbing a part, the stop time, the operation velocity, the operation acceleration and the like while considering the cycle time.

Solution to Problem

In order to achieve the object, the following configuration is provided as a feature.

An arithmetic device which calculates setting of operation control in a parts mounting device which mounts parts on a substrate, the parts mounting device including a supply device which supplies the parts; an attachment device including a parts holding member to take out and hold the part, a general control device which controls operations of respective regions including the supply device and the attachment device in a mounting operation including an operation of taking out the part by using the parts holding member and an attachment operation of attaching the part taken out and held by the part holding member to a substrate, in accordance with information of the setting; and a detection device which detects a state concerning the part holding member and the part at time of the operation of taking out and holding the part, the arithmetic device including an arithmetic control unit which conducts calculation processing; and a storage unit which stores data information to be used in the calculation processing, the arithmetic control unit conducting (1) first processing of acquiring or calculating a state parameter which represents a distance between the part holding member and the part or relative positions at the time of operation of taking out and holding the part, by using the detection device and storing information thereof into the storage unit, (2) second processing of calculating a variation value of the stored state parameter in the operation of taking out and holding the part and storing information thereof into the storage unit, and (3) in response to excess of the variation value of the state parameter over a first threshold, third processing of selecting a parameter value to be modified, out of parameter values representing a holding position, stop time, an operation velocity, and operation acceleration, on the basis of information of effectiveness to variation reduction of the state parameter when modified and an increase quantity of time required for substrate production when modified, and conducting modification.

Furthermore, in the third processing, in a case where a difference between a variation value of the state parameter before modification of the parameter value and a variation value of the state parameter after the modification of the parameter value exceeds a second threshold, the parameter value is determined to be a parameter value that is effective to the variation reduction.

Furthermore, the second threshold used to calculate the variation value in a case where the number of data is large is made smaller in value than the second threshold used in a case where the number of data is small. Furthermore, a variance value is calculated as the variation value of the state parameter, and the variance value is utilized. Furthermore, the variation value of the state parameter and modification contents information including values before and after the modification concerning the parameter in the setting are displayed on an output device included in the parts mounting device or the arithmetic device, and the modification is executed after user's confirmation.

Advantageous Effects of Invention

According to the present invention, it is possible to lower the occurrence rate of abnormalities while holding down the increased quantity of the cycle time. Other objects, features and advantages of the present invention will become apparent from ensuing description of embodiments of the present invention with reference to accompanying drawings.

BRIEF DESCRIPTION OF DRAWINGS

FIG. 10 is a diagram showing a table example of attachment information;

FIG. 11 is a diagram showing a table example of operation information;

FIG. 12 is a diagram showing a table example of adsorption result information;

FIG. 13 is a diagram showing a table example of variation information,

FIG. 14 is a diagram showing a table example of threshold information;

FIG. 15 is a diagram showing a table example of reduction effect information;

FIG. 16 is a diagram showing a table example of cycle change quantity information;

DESCRIPTION OF EMBODIMENTS

Hereafter, an embodiment (the arithmetic device, the parts mounting device and others) of the present invention will be described with reference to FIGS. 1 to 18. By the way, throughout all diagrams for describing the embodiment, the same unit is denoted by the same character in principle, and duplicated description thereof will be omitted. As symbols in description, for example, a feeder is denoted by F, a nozzle is denoted by N and a part is denoted by P.

Figure 1:
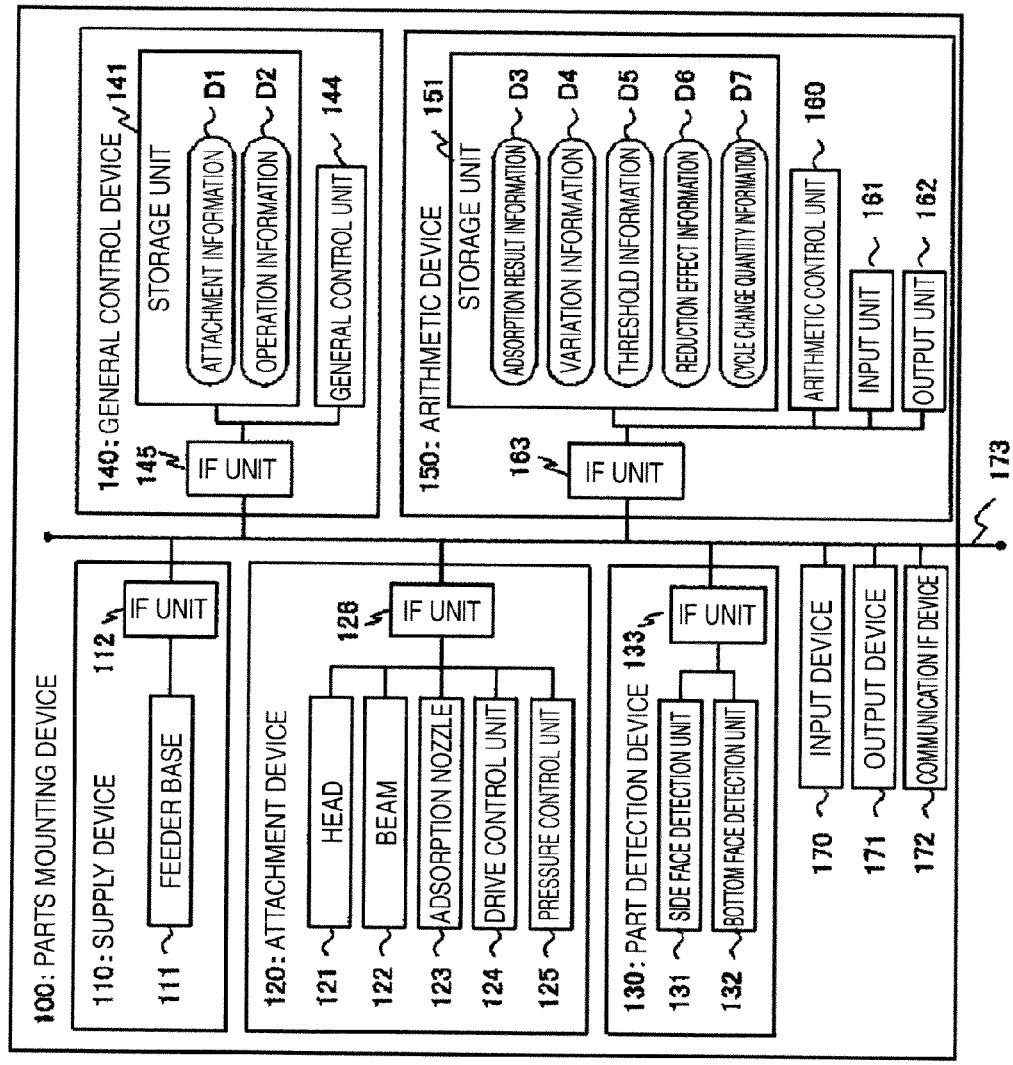
FIG. 1 is a diagram showing a configuration example of a parts mounting device (including an arithmetic device) which is an embodiment of the present invention.
Figure 2:
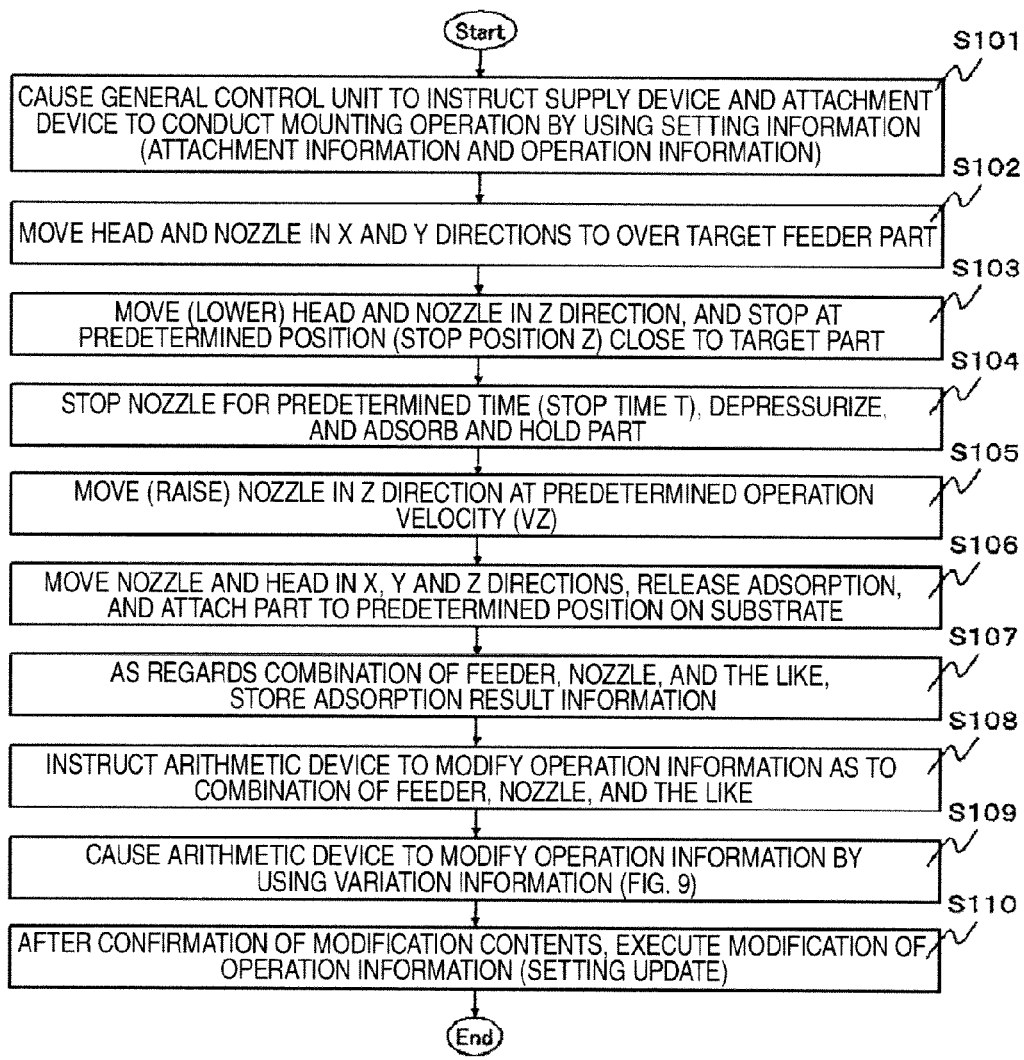
FIG. 2 is a flow diagram showing a processing example in the present parts mounting device.
Figure 3:
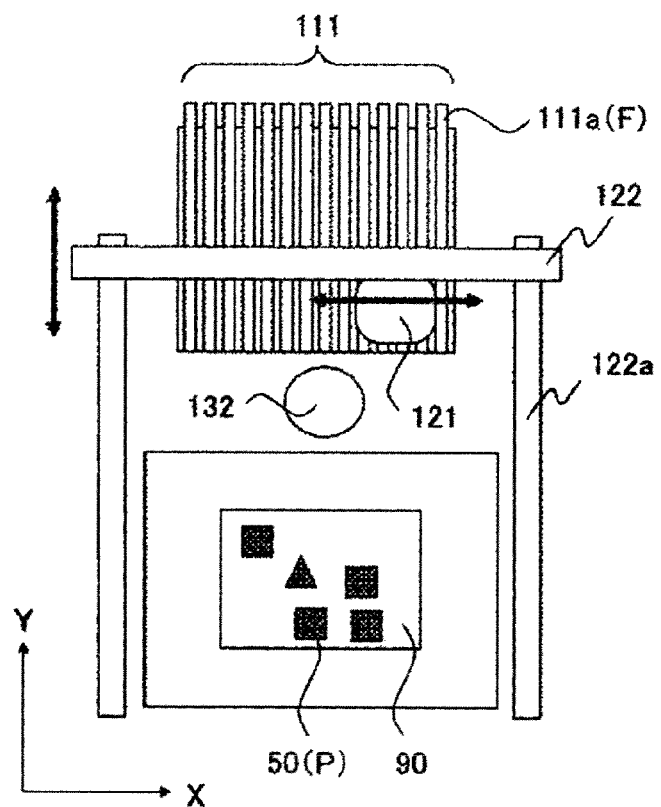
FIG. 3 is a diagram schematically illustrating a configuration example of regions such as a feeder and a head and a configuration example of mounting of a part to a substrate in the present parts mounting device.
Figure 4:
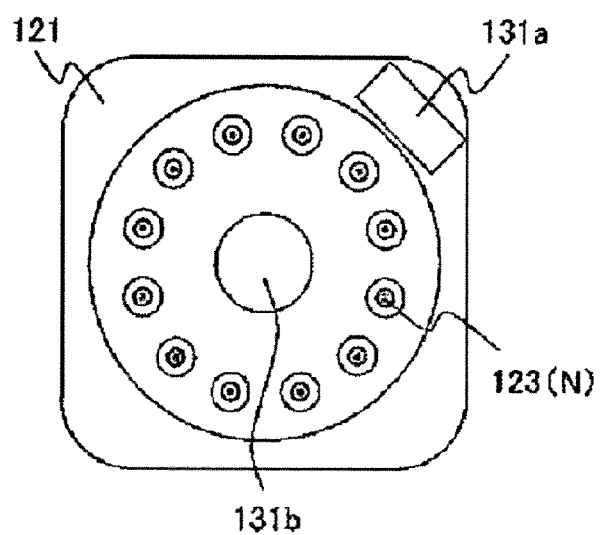
FIG. 4 is a diagram illustrating a configuration example of a head and a nozzle.
Figure 9:
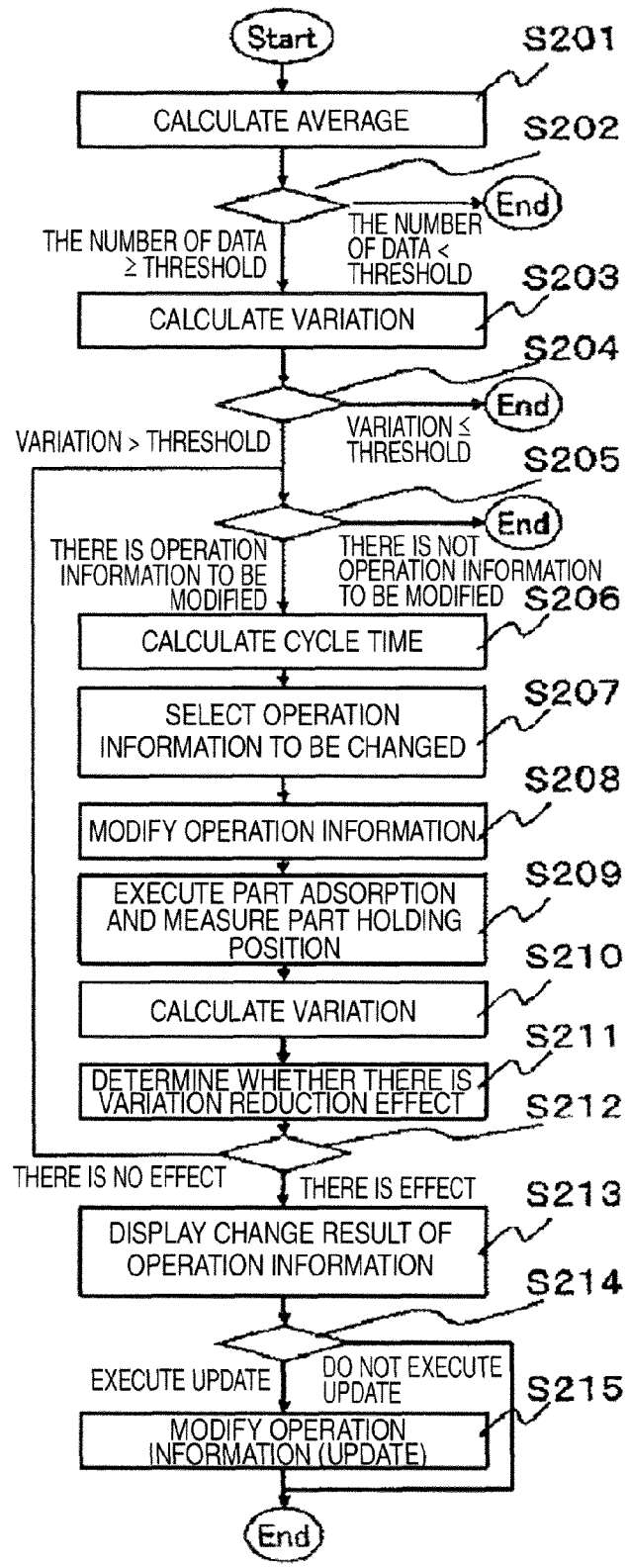
FIG. 9 is a flow diagram showing a processing example (calculation and modification processing of operation information) in the present arithmetic device.
Figure 17:
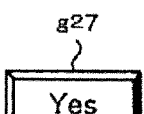
FIG. 17 is a diagram showing a screen example of confirmation.

A parts mounting device 100 (an arithmetic device 150) according to the present embodiment conducts processing as shown in FIGS. 2 and 9 (including processing of calculating, determining and modifying a part mounting method (operation control setting information) in the parts mounting device 100) on the basis of hardware and software configurations shown in FIGS. 1, 3 and 4. Data information as shown in FIGS. 10 to 16 is managed. A user (such as an operator who utilizes and manages a system including the present parts mounting device 100) can input/output information by using the screen as shown in FIG. 17.

As one of features, a modified value of a parameter such as a stop position (Z) of a nozzle N at the time of adsorption, stop time (T), or an operation velocity (V) (a modified value suitable for lowering the abnormality occurrence rate) is calculated by using variation information concerning a holding position (HX, HY) of a part P by a nozzle N, and a distance (KZ) between the nozzle N and the part P at processing step 109 (details are shown in FIG. 9) in FIG. 2. A result is reflected to setting information of operation control in the parts mounting device 100.

[Parts Mounting Device]

FIG. 1 shows a configuration of a parts mounting device 100 and an arithmetic device 150 according to an embodiment of the present invention. The arithmetic device 150 is provided within the parts mounting device 100. By the way, a form in which the arithmetic device 150 is provided outside the parts mounting device 100 and connected to the parts mounting device 100 may be used, or a form in which the arithmetic device 150 and a general control device 140 are unified to one body may be used.

The parts mounting device 100 includes a supply device 110, an attachment device 120, a part detection device 130, a general control device 140, an arithmetic device 150, an input device 170, an output device 171, and a communication IF device 172. They are connected to each other via a bus 173. The input device 170 is, for example, a mouse, a keyboard and the like for accepting information input by user's operation. The output device 171 is, for example, a display, a printer, and the like for outputting information to the user. The communication IF device 172 is an interface which is connected to other devices or systems (which can be connected to an existing production management system or the like) via the bus 173 and an external network to transmit and receive information. The bus 173 couples respective units (110 to 172). I/F units (112 to 163) in respective devices (110 to 150) are interfaces for transmitting and receiving information via the bus 173.

The supply device 110 includes a feeder base 111 having a plurality of feeders F, and an IF unit 112. The supply device 110 has a physical configuration, details of which are exemplified in FIG. 3 (FIG. 3 shows an example, and various configurations are possible).

The attachment device 120 includes a head 121, a beam 122, a nozzle (adsorption nozzle) 123, a drive control unit 124, a pressure control unit 125, and an IF unit 126. The attachment device 120 has a physical configuration, details of which are exemplified in FIG. 3 (FIG. 3 shows an example, and various configurations are possible). The drive control unit 124 controls regions (FIGS. 3 to 5) such as the head 121, the beam 122 and the nozzle 123 to attach a component to part attachment position coordinates on a substrate shown in attachment information 142 (FIG. 10) described later in an attachment order shown in the attachment information 142, in response to an instruction from the general control device 140. The pressure control unit 125 controls the pressure within the nozzle 123 in response to an instruction from the general control device 140. For example, the pressure control unit 125 receives an instruction for lowering the pressure within the nozzle 123 to adsorb the part P to the nozzle 123, from the general control unit 140.

The part detection device 130 includes a side face detection unit 131, a bottom face detection unit 132, and an IF unit 133. In response to an instruction from the general control unit 140, the side face detection unit 131 picks up an image of the nozzle 123 (N) which has absorbed the part P from the side (side face), and measures and calculates a distance (KZ) between the nozzle N and the part P in the Z direction (FIG. 5) by using this image and a means such as pattern matching (image processing) (as described later with reference to FIGS. 5 and 6). The side face detection unit 131 includes a light reception unit 131a and a light emission unit 131b mounted on the head 121, for example, as shown in FIG. 4, and has a calculation processing function of the value (KZ).

Furthermore, in response to an instruction from the general control unit 140, the bottom face detection unit 132 picks up an image of the nozzle 123 (N) which has absorbed the part P from below, and measures and calculates a position (HX, HY) in the X and Y directions (FIG. 3) in which the nozzle holds the part P by using this image and a means such as pattern matching (image processing) (as described later with reference to FIGS. 7 and 8). The bottom face detection unit 132 is disposed between the feeder base 111 and a substrate 90, for example, as shown in FIG. 3, and has a calculation processing function of the value (HX, HY).

In the present embodiment, the calculation processing of the values KZ, HX and HY is conducted by the side face detection unit 131 and the bottom face detection unit 132, and the arithmetic device 150 acquires the result. Alternatively, the calculation processing may be conducted in another region such as the arithmetic device 150. In a case where the arithmetic device 150 conducts the calculation processing, the arithmetic device 150 acquires each kind of data information (for example, image data) from the side face detection unit 131 and the bottom face detection unit 132, and calculates respective values. Furthermore, means for obtaining the values are not restricted to the means such as image pickup and pattern matching, but various means can be applied.

The general control device 140 is a main control unit of the parts mounting device 100, and provided with a general control unit 144, a storage unit 141, an IF unit 145, and the like. In the memory area of the storage unit 41, attachment information D1 (described later, FIG. 10) and operation information D2 (described later, FIG. 11), and the like, are stored.

The general control device 144 controls processing conducted in the supply device 110, the attachment device 120, the part detection device 130, the arithmetic device 150, the input device 170, the output device 171, the communication IF device 172, and the like. The general control device 140 controls operation of respective regions (including the feeder F and the nozzle F) such as the supply device 110, the attachment device 120, and the part detection device 130 in accordance with the attachment information D1 and the operation information D2. The general control device 144 causes a predetermined nozzle N from a predetermined F to adsorb a part P in accordance with setting stored in the operation information D2 in accordance with an order stored in the attachment information D1. At the time of the adsorption, the general control device 144 causes the part detection device 130 to calculate the part holding position HX and HY, the distance KZ, and the like. And the general control device 144 causes the part P to be attached in a position on the substrate stored in the attachment information D1.

The attachment information D1 and the operation information D2 (storage information of them) are one kind of information (setting information) for controlling operation (mounting operation) of respective regions in the parts mounting device 100.

[Arithmetic Device]

The arithmetic device 150 includes an arithmetic control unit 160, a storage unit 160, an input unit 161, an output unit 162, and an IF unit 163. Adsorption result information D3 (described later, FIG. 12), variation information D4 (described later, FIG. 13), threshold information D5 (described later, FIG. 14), reduction effect information D6 (described later, FIG. 15), cycle change quantity information D7 (described later, FIG. 16), and the like are stored in a storage area in the storage unit 151.

The arithmetic device 150 can be implemented by using a typical computer, IC or the like. For example, the arithmetic control unit 160 can be implemented by using hardware such as a CPU and a memory (such as a ROM or RAM), software program processing using it (processing using a program in the present embodiment), or the like. Each processing function (including processing shown in FIG. 2 and FIG. 9) is implemented by, for example, causing the arithmetic control unit 160 to load and execute a program stored in the storage unit 151 or outside. The storage unit 151 can be implemented by using an external storage device such as various memories and an HDD, a reading/writing device for reading/writing information on a storage medium such as a CD or a DVD, a device for reading/writing data in an external network, or the like. The input unit 161 can be implemented by using an input device such as a keyboard or a mouse for accepting information input caused by user operation. The output unit 162 can be implemented by using an output device such as a display which outputs information to the user. The IF unit 163 can be implemented by using an interface connected to a bus 173 to transmit/receive information via the bus 173.

The arithmetic control unit 160 conducts processing of calculating variation concerning the part holding position HX and HY and the distance KZ by using information (actual result data) stored in the adsorption result information D3 and modifying information (setting information) stored in the operation information D2 on the basis of a decision (described later, FIGS. 2 and 9 and the like).

The adsorption result information D3, the variation information D4, the threshold information D5, the reduction effect information D6, and the cycle change quantity information D7 stored in the arithmetic device 150 are managed as information required in processing in the arithmetic device 150. By the way, these kinds of information may be unified with or separated from each kind of information (the attachment information D1 and the operation information D2) in the general control device 140 as occasion demands.

[Supply Device and Attachment Device]

FIG. 3 shows a schematic configuration (top face) of the feeder base 111, the head 121, the beam 122, a guide 122a, and the like relating to the supply device 110 and the attachment device 120 in FIG. 1. The feeder base 111 includes a plurality of feeders 111a (F). The part supply device (feeder base 111) is, for example, a tape type. For example, a plurality of parts P to be supplied are mounted every feeder F. For example, if one part P stored in the feeder F is adsorbed by the nozzle N (FIG. 4) on the head 121, the feeder F automatically conveys the next one in the remaining parts P as far as a position where the nozzle N can adsorb (in the Y direction in FIG. 3) in response to an instruction from the general control device 140.

Operation of the head 121, the beam 122 and the like is controlled in response to an instruction from the general control device 140. The head 121 is configured to be movable in one coordinate axis direction (in the X direction in FIG. 3) along the beam 122. The beam 122 is configured to be movable in another coordinate axis direction (in the Y direction in FIG. 3) crossing the coordinate axis direction in which the head 121 moves. In addition, the head 121 (the nozzle N mounted on the head 121) is configured to be movable in a direction (Z direction) perpendicular to the X and Y directions.

In the configuration, the head 121 and the beam 122 are moved in the X and Y directions. The nozzle N included in the head 121 is moved in the Z direction. A predetermined part P (50) can be adsorbed from a predetermined feeder F by a predetermined nozzle N. In addition, respective portions are moved in the X, Y and Z directions in the same way. As a result, the part P (50) can be attached to a predetermined position on the substrate 90.

[Head, Nozzle]

FIG. 4 shows a bottom face as a configuration example of the head 121. The head 121 includes a plurality of nozzles 123 (N) on a bottom face portion thereof. In addition, the light reception unit 131a and the light emission unit 131b which are components of the side face detection unit 131 are mounted on the bottom face portion of the head 121. In the present example, a plurality of (for example, twelve) nozzles are disposed in a circular form. The head 121 is a mechanism capable of utilizing a desired nozzle N by rotation control or the like. Furthermore, the head 121 is a mechanism capable of picking up an image of a desired nozzle N with the light reception unit 131a by rotation control or the like in the same way. The position of each nozzle is identified by a number.

Besides, various forms can be applied as regards the head 121 and the nozzle N. For example, a configuration in which a plurality of heads 121 and nozzles N are mounted on one unit can be mentioned.

[Side Face Detection Unit, Distance KZ]

Figure 6:
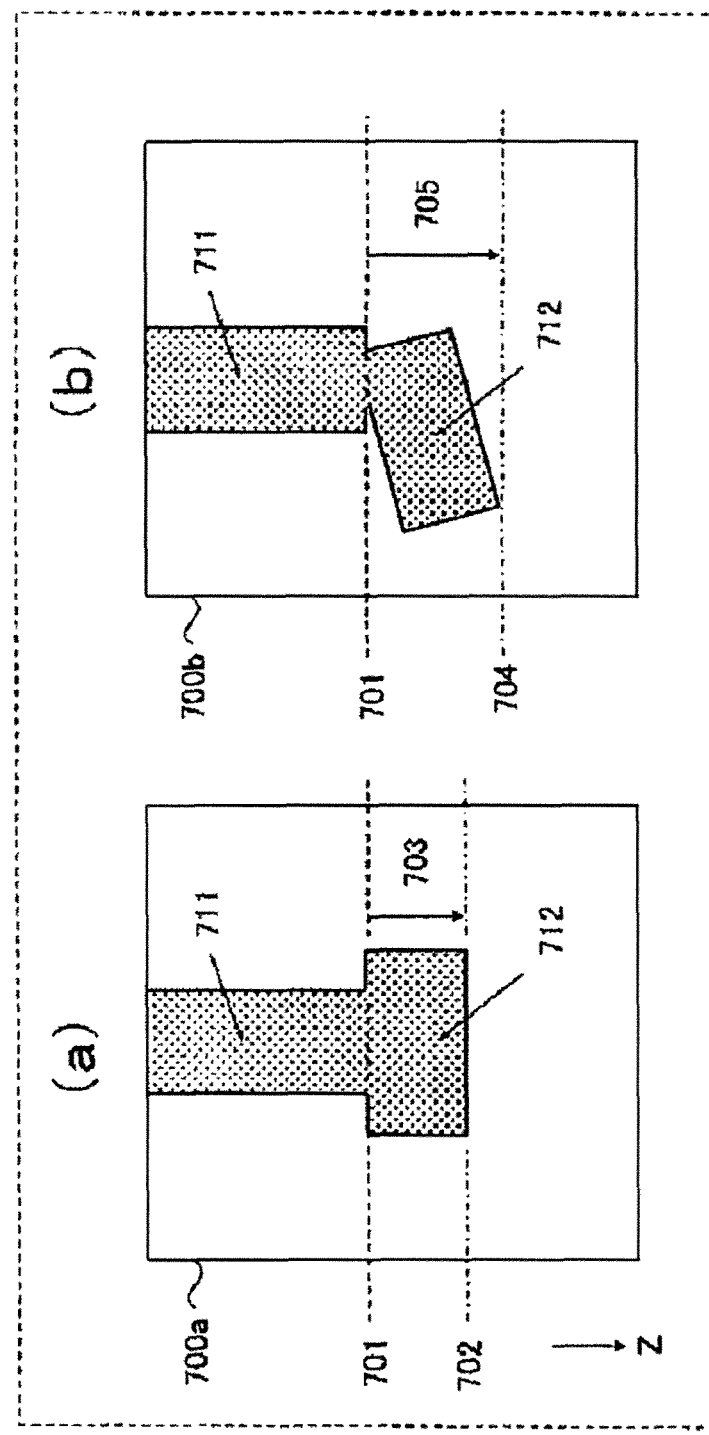
FIG. 6 is a diagram illustrating an example of an image obtained by a side face detection unit.

In the side face detection unit 131, the light reception unit 131a (FIG. 4) receives light emitted from the light emission unit 131b and creates (picks up) an image, for example, as shown in FIG. 6 from a portion that becomes a shadow of light. And the side face detection unit 131 calculates a relative distance KZ of the part P from the nozzle N on the basis of the image picked up.

Figure 5:
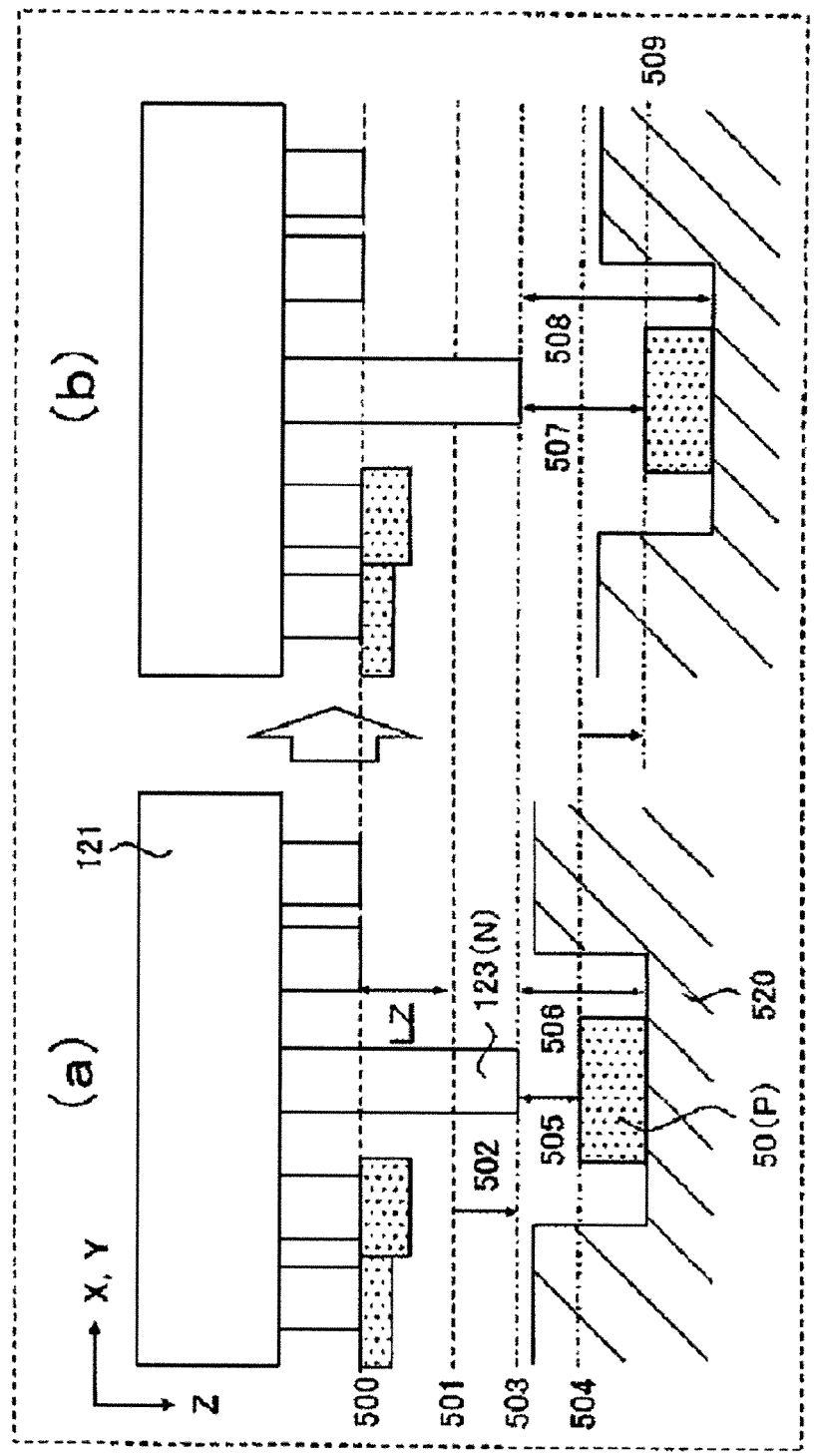
FIG. 5 is a diagram illustrating an example of positions of a part and a nozzle at the time of adsorption when viewed from a side face.

FIG. 5 shows an example in which positions of the part P and the nozzle N on the feeder F at the time of adsorption are viewed from the side face. This is a case where the part 50 (P) is stored in each concave portion 520 of the feeder F. In FIG. 5, (a) shows a case where, for example, the part 50 (P) is in a standard position (stop position L) on setting, and (b) shows a case where the part 50 (P) deviates from (a) a little.

In FIG. 5(a), reference numeral 500 denotes a stop position of the nozzle N at the time of movement of the head 121. Reference numeral 501 denotes a reference line (Z direction position (z)=0) in the Z direction concerning the position (stop position L) of the nozzle N. For example, a downward direction (downward direction of the nozzle N) with reference to the reference line 501 is denoted by + (positive) direction and an upward direction is referred to as − (negative). A distance between 500 and 501 is LZ. Numeral 503 denotes a line of the nozzle stop position L determined by a tip (bottom end) of the nozzle N. Numeral 502 denotes a Z direction position (z) of the nozzle N corresponding to the stop position L 503. Numeral 504 denotes a line of a part position determined by a top end of the part P. Numeral 505 denotes a distance between the bottom end of the nozzle N and the top end of the part P. Numeral 506 denotes a distance between the bottom end of the nozzle N and a bottom end of the part P (a base of a concave portion 520).

As for the position of the part P in the feeder F (concave portion 520), a deviation or variation might occur in directions including the Z direction. For example, in a case where the feeder is moved by conveyer, it is considered that the face of the concave portion 520 deviates in the Z direction a little. As a result, the relative position (distance) of the part P as compared with the nozzle N deviates a little.

FIG. 5, (b) shows a case where the position of the part P deviates to an opposite side (+Z direction) from the position of the nozzle N to apart from the nozzle N. Numeral 509 denotes a line of the part position determined by the top end of the part P. A distance between the lines 504 and 509 corresponds to the magnitude of the deviation. In this case, a distance (507 or 508) between the nozzle N and the part P is larger as compared with FIG. 5, (a). In other words, it becomes difficult for the nozzle N to adsorb the part P, and an abnormality (an abnormality such as oblique adsorption of the part P, adsorption of an end of the part P, impossibility of adsorption of the part P, or falling after adsorption) becomes apt to occur.

FIG. 6 shows an example of an image picked up by the side face detection unit 131. A case of bi-value image data is shown. In an image 700a shown in FIG. 6(a), numeral 711 denotes a portion corresponding to the nozzle N and numeral 712 denotes a portion corresponding to the part P Numeral 701 denotes a measurement reference line in the Z direction, which is a straight line passing through the tip (bottom end) of the nozzle N. Numeral 702 denotes a straight line of the bottom end of the part P. Numeral 703 denotes a distance KZ between 701 and 702. In an image 700b in FIG. 6, (b), a case where inclination of the part P at the time of adsorption is large is shown to make the concept of the distance KZ easy to understand. Numeral 704 denotes a straight line passing through a bottom end of the part P. Numeral 705 denotes a distance KZ between 701 and 704.

As for the distance KZ defined here, there is a relation that the KZ value becomes large as the inclination of the part P when absorbed by the nozzle N becomes larger as shown in FIG. 6, (b) as compared with FIG. 6, (a). As the KZ value becomes large as shown in FIG. 6, (b), the abnormality occurrence rate becomes higher. In the present embodiment, modification concerning the position of the nozzle N and the like at the time of adsorption is conducted depending upon whether the variation value of the distance KZ is large or small.

In the present embodiment, the distance KZ is defined simply as a distance from the nozzle N to the part P in the Z direction. As for a calculation method of the distance KZ, the distance KZ is calculated as a distance from the tip (701) of the nozzle N to the bottom end (702 or the like) of the part P in the examples shown in FIG. 6, As for the distance KZ, other definitions (calculation methods) may be used. For example, an end of the distance is not restricted to a bottom end or a top end, but the distance may be a distance between reference points. In addition, a value calculated by a predetermined formula with a distance value or the like given as an input may be used. Furthermore, the distance value is not restricted to the Z direction, but the distance value may be calculated inclusive of the X and Y directions.

[Bottom Face Detection Unit, Part Holding Position HX and HY]

The bottom face detection unit 132 calculates part holding position HX and HY on the basis of a difference between the center of the part P and the center of the nozzle N in the X and Y directions obtained from an image picked up.

Figure 7:
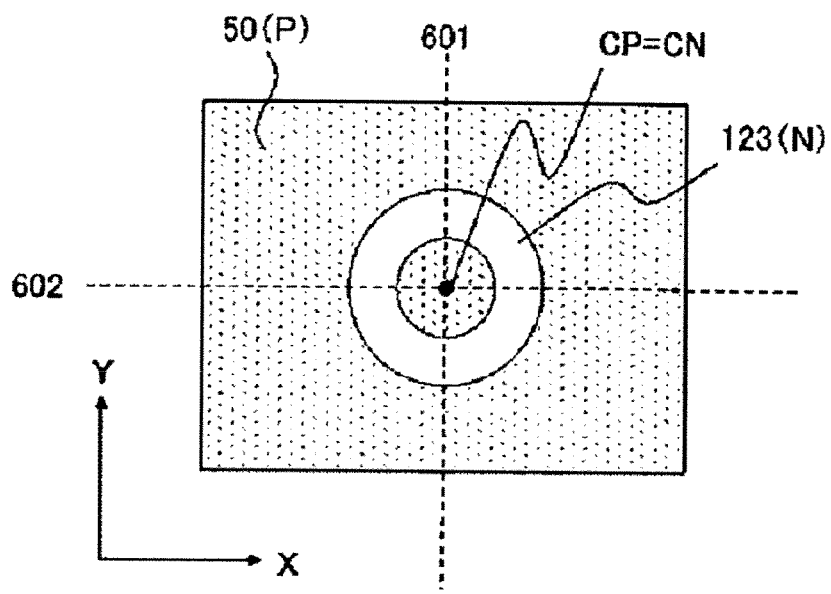
FIG. 7 is a diagram illustrating an example of positions of the part and the nozzle at the time of adsorption when viewed from above.

FIG. 7 shows an example of positions of the part P and the nozzle N at the time of adsorption when viewed from above. In this case, the center of a circular nozzle N lies upon the center of a rectangular part P in the X and Y directions (the same as FIG. 3). The outer circle is the external shape of the nozzle N, and the inner circle is the inside diameter of the nozzle N. CP denotes the center point of the part P and CN denotes the center point of the nozzle N. Numerals 601 and 602 denote reference lines in the X and Y directions passing through CP. In a large number of parts, the case where CN coincides with CP is an ideal adsorption state.

Figure 8:
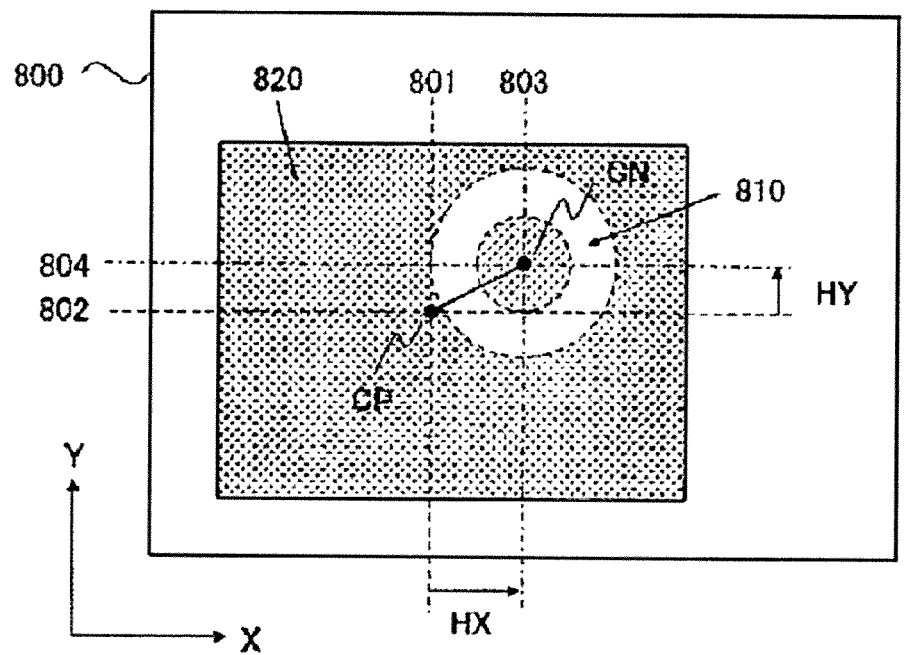
FIG. 8 is a diagram illustrating an example of an image obtained by a bottom face detection unit.

FIG. 8 shows an example of an image picked up by the bottom face detection unit 132 (in correspondence relation to FIG. 7). C is a measurement reference point, and is a point that coincides with CP. Numerals 801 and 802 pass through C, and they are not reference lines in an absolute coordinate system but denote measurement reference lines in conformity with a coordinate system in the part P unit (for example, in the case of FIGS. 7 and 8, a direction parallel to a long side is X and a direction parallel to a short side is Y). The measurement reference line 801 in the X and Y directions is a straight line that is the same as 601 in FIG. 7 in relative relation to the part. For example, in FIG. 7, the line 601 is a straight line parallel to the short side of the part. In this case, the line 801 also becomes a straight line parallel to the short side of the part. In the same way, the line 802 is a straight line that is the same as 602 in FIG. 7 in relative relation to the part. The lines 801 and 802 are not reference lines in the absolute coordinate system, but reference lines in conformity with the coordinate system (for example, the long side is in the X direction and the short side is in the Y direction) in the part P unit. Numeral 820 denotes a portion corresponding to the part P. Numeral 810 (an area indicated by dashed lines) denotes a portion corresponding to the nozzle N. Numerals 803 and 804 denote straight lines which pass through the nozzle center CN and which are parallel to the measurement reference lines 801 and 802 in the X and Y directions. The portion 810 is hidden by the part P (820) and does not come out on the image 800 because the image is picked up from below. However, the nozzle center CN can be grasped by moving the nozzle N to a predetermined position (for example, the center of an image region picked up).

PX and PY in FIG. 7 correspond to the part holding position HX and HY in FIG. 8. HX and HY become differences in associated directions that coincide in directions with the X and Y directions of the part P at the time when the part P is mounted on the feeder F (the X and Y directions in the absolute coordinate system). For example, when a rectangular shaped part P is mounted on the feeder F, it is supposed that the long side of the part P is parallel to the X direction in FIG. 3 and the short side is parallel to the Y direction in FIG. 3. In this case, the part holding position HX represents a difference between the part center CP and the nozzle center CN in a direction parallel to the long side of the part P, and in the same way, the part holding position HY represents a difference between CP and CN in a direction parallel to the short side of the part P.

As the HX and HY values become large, deviations are large and it becomes difficult for the nozzle N to adsorb the part P, and an abnormality (an abnormality such as oblique adsorption of the part P, adsorption of an end of the part P, impossibility of adsorption of the part P, or falling after adsorption) becomes apt to occur.

[Processing Outline (FIG. 2)]

FIG. 2 shows a flow of general processing outline in the parts mounting device 100 including features of the present embodiment (S101 and the like indicate processing steps). In particular, a detailed configuration example of S109 will be described later with reference to FIG. 9.

(S101) The general control unit 144 in the general control device 140 instructs respective units including the supply device 110 and the attachment device 120 to conduct mounting operation by using the attachment information D1 (FIG. 10) and the operation information D2 (FIG. 11).

(S102) On the basis of the instruction at S101, the supply device 110 causes the feeders (111a) and the like to operate, and the attachment device 120 causes the head 121, the beam 122, the nozzle N (123) and the like to operate. In particular, the target head 121 and the nozzle N are moved in the X and Y directions (FIG. 3) and moved as far as the position of the target feeder F-part P (adsorption target).

(S103) Subsequently, the nozzle 123 (N) is moved (lowered) in the 7 direction (FIG. 5), moved as far as a predetermined position (the stop position Z of the nozzle N) on the center of the target part P, and stopped. By the way, in the present embodiment, S2 (movement in the X and Y directions) and S3 (movement in the Z direction) are separated. However, it is also possible to collect S2 and S3 to one and exercise simultaneous control (movement in the X, Y and Z directions).

(S104) The nozzle N is stopped in the stop position for a predetermined time (stop time T) The part P is adsorbed and held by depressurization within the nozzle N conducted by the pressure control unit 125.

(S105) The nozzle N is moved (raised) from the stop position L as far as 500 in the Z direction (FIG. 5) at a predetermined operation velocity VZ.

Furthermore, in the present embodiment, the distance KZ is calculated by picking up an image of the nozzle N in a state in which the nozzle N adsorbs and holds the part P from the side face with the side face detection unit 131 at the time of S4 and S5.

(S106) In addition, the head 121, the nozzle N and the like are moved in the X, Y and Z directions, moved as far as a part attachment position of the substrate. The part P is attached by canceling the adsorption (FIG. 3).

Furthermore, in the present embodiment, the part holding position HX and HY are calculated by picking up an image of the nozzle N in a state in which the nozzle N adsorbs and holds the part P from below with the bottom face detection unit 132 at the time of S106.

(S107) As regards the combination of the feeder F, the nozzle N, and the like caused to operate at S1 to S6 described above, adsorption result information 152 which becomes actual result data is created and stored in the storage unit 151 in the arithmetic device 150. The adsorption result information 152 includes information of the distance KZ and the part holding position HX and HY. This storage may be conducted at other timing. For example, the arithmetic device 150 may acquire the adsorption result information 152 and the like from external (such as the general control device 140) as occasion demands. Actual result data is stored in the same way whenever each of a plurality of times of part mounting operation is conducted.

(S108) After attachment of the part P, the general control unit 144 in the general control device 140 instructs the arithmetic device 150 to conduct modification of the operation information D2 (including determination as to whether modification is necessary) as to the combination of the feeder F, the nozzle N, and the like caused to operate at S1 to S7.

(S109) The arithmetic control unit 160 in the arithmetic device 150 conducts processing for calculating and modifying the operation information D2 by using the adsorption result information 152 on the basis of the instruction (details are shown in FIG. 9). The stop position Z (11c), the stop time T (11d) and the operation velocity VZ (11e) of the nozzle N are included as targets and candidates to be modified.

(S110) The arithmetic control unit 160 and the like in the arithmetic device 150, for example, displays modification contents information obtained at S109 on a screen and causes a user to confirm execution of the modification (described later, FIG. 17). Upon confirmation, the arithmetic control unit 160 transmits the modification contents information obtained at S109 (including whether modification is necessary) to the general control device 140 as a response. As a result, the general control unit 144 updates (resets) the contents of the operation information 143. By the way, a form in which the user's confirmation using the screen is omitted may be used. In that case, a form in which setting information within the general control device 140 is automatically updated is obtained.

[Attachment Information]

FIG. 10 shows an example of an attachment information table which is an embodiment of the attachment information D1. The attachment information table includes fields such as order 10a, part attachment position coordinate 10b, feeder number 10c, and adsorption nozzle number 10d. D1 (its storage information) includes information such as order, position, feeder F, and the nozzle N at the time when the nozzle N adsorbs the part P from the feeder F and at the time when the part P is attached onto the substrate. By the way, although not illustrated, D1 may include other fields such as a part ID.

The order 10a stores information indicating an attachment order of the part P to the substrate, and information indicating an adsorption order of the part P by the nozzle N. In the present embodiment, the attachment order and the adsorption order are configured to become the same. However, they may be different from each other. As for the part attachment position coordinate 10b, information of a coordinate in the X and Y directions on the substrate is stored as information indicating a position where the part P is attached to the substrate (90 in FIG. 3).

The feeder number 10c stores information indicating the feeder F (position) that holds the part P. In the present embodiment, a feeder number that uniquely identifies the mounting position of the feeder F (111a) in the feeder base 111 (FIG. 3) is stored. The adsorption nozzle number 10d stores information indicating the nozzle N that adsorbs the part P. In the present embodiment, an adsorption nozzle number (for example, 1 to 12) assigned to uniquely identify a mounting position of the nozzle N is used as information identifying the position of the nozzle N in the head 121 (FIG. 4) associated with the nozzle N.

[Operation Information]

FIG. 11 shows an example of an operation information table which is an embodiment of the operation information D2. The operation information table includes fields such as feeder number 11a, adsorption nozzle number 11b, stop position (L) 11c (X direction position (x), Y direction position (y), and Z direction position (z)), stop time (T) 11d, and operation velocity (VZ) 11e (modification coefficient). D2 (its storage information) includes information such as the stop position L, the stop time T, and the operation velocity V of the nozzle N at the time when the nozzle N adsorbs the part P from the feeder F.

The feeder number 11a stores information identifying the position of the feeder F (that mounts the target part P) (in the same way as 10c). The adsorption nozzle number 11b stores information identifying the position of the nozzle N (that adsorbs the target part P) (in the same way as 10d). The stop position 11c (L(x, y, z)) stores information identifying the stop position Z (in other words, the adsorption position) in a case where the nozzle N indicated by 11b adsorbs the part P mounted in the position (feeder F) indicated by 11a. The stop position Z indicates a position in the Z direction in FIG. 5. For example, as shown in FIG. 5, the nozzle N is lowered to a position where the distance from the reference line 501 (z=0) becomes the same as the value of z stored in 11c, and stopped.

The stop time (T) 11d stores information of a modified value concerning the stop time T of the nozzle N (corresponding head 121 and the like) in the stop position Z in 11c at the time when the nozzle adsorbs the part P in the pertinent position (feeder F). In the present example, the nozzle N is stopped for a time corresponding to a value in 11d, For example, in a case where the value in 11d is 1, T is set to T=0.01 second.

In the operation velocity (VZ) 11e (modification coefficient), information that identifies the operation velocity V of the nozzle N at the time when the nozzle N adsorbs the part P in the pertinent position (feeder) is stored. In the present embodiment, at least an operation velocity VZ is included as the operation velocity V. The operation velocity VZ is an operation velocity at the time when raising the nozzle N, in a state in which the nozzle N adsorbs the part P, in the Z direction. The operation velocity 11e is represented by a modification coefficient. A value obtained by multiplying a predetermined standard operation velocity value in setting by the value indicated in 11e becomes an actually used operation velocity (modified value). The control of 11e (VZ) may be applied to the time of other movement. For example, the control may be applied to the movement in the X and Y directions, and the movement of the head 121, the beam 122 and the like.

[General Control Example]

Hereafter, an example of control of a part mounting operation conducted by the general control device 140 (the general control unit 144) using the attachment information D1 (FIG. 10) and the operation information D2 (FIG. 11) will be described. The general control unit 144 instructs the supply device 110, the attachment device 120, and the like to adsorb the part P mounted in the feeder F position (d10) in the feeder number 10c in the order 10a in the attachment information D1 with the nozzle N (d11) in the adsorption nozzle number 10d, move the part P to the part attachment position coordinate 10d on the substrate, and attach the part P. Characters such as d10 are characters for distinction.

The general control unit 144 positions (stops) the nozzle N (d11) in a position in the X and Y directions where the center of the nozzle coincides with the center of the part and in the stop position Z (d12) in 11c in the operation information D2 in the Z direction. The general control unit 144 instructs the pressure control unit 125 to depressurize the inside of the nozzle N (d11). The general control unit 144 causes the nozzle N (d11) to adsorb the part P by stopping the nozzle N (d11) for the stop time T (d13) in 11d. After elapse of the stop time T (d13), the general control unit 144 moves the nozzle N (d11) at the operation velocity VZ (d14) in 11e.

After the adsorption, the general control unit 144 moves the nozzle N (d11), in a state in which the nozzle N (d11) adsorbs the part P, to a position where an image can be picked up by the side face detection unit 131 (FIG. 4) and causes the side face detection unit 131 to pick up an image from the side face. As a result, the general control unit 144 causes the distance KZ (d15) to be calculated. Furthermore, the general control unit 144 moves the nozzle N (d11), in a state in which the nozzle N (d11) adsorbs the part P, to a predetermined position where an image can be picked up by the bottom face detection unit 132 (FIG. 3) and causes the bottom face detection unit 132 to pick up an image from below. As a result, the general control unit 144 causes the part holding position HX (d16) and HY (d17) to be calculated.

The general control unit 144 stores values of the feeder position in 10c (d10), the nozzle N in 10d (d11), the stop position Z in 11c (d12), the stop time T in 11d (d13), the operation velocity VZ (d14) in the operation, and the distance KZ (d15) and the part holding position HX (d16) and HY (d17) calculated as described above, into fields (12a to 12h) in the final row in the adsorption result information D3 (FIG. 12).

And the general control unit 144 moves the nozzle N (d11) to the part attachment position coordinate 10b on the substrate and instructs the pressure control unit 125 to cancel the depressurization of the inside of the nozzle N (d11), and thereby attaches the part P to the position.

[Adsorption Result Information]

FIG. 12 shows an example of an adsorption result information table which is an embodiment of the adsorption result information 152. The adsorption result information D3 stores information (actual result data) of a part adsorption result including information detected and calculated by using the part detection device 130. The adsorption result information table includes fields such as feeder number (12a), adsorption nozzle number (12b), stop position (Z) (12c), stop time (T) (12d), operation velocity (VZ) (12e), part holding position HX (12f), part holding position HY (12g), and distance KZ (12h). The fields 12a to 12e are fields corresponding to 11a to 11e in FIG. 11. The values (d10 to d17) as described above are stored in the fields 12a to 12e as described in S7 and [general control example].

Information identifying the part holding positions HX and HY detected and calculated by the bottom face detection unit 132 as described earlier (FIGS. 7 and 8) is stored in the part holding positions HX (12f) and HY(12g). In the present example, a value obtained by setting equal to 0 when CP=CN in FIG. 7 is stored. Information identifying the distance KZ detected and calculated by the side face detection unit 131 described earlier (FIGS. 5 and 6) is stored in the distance KZ (12h). In the present example, a distance in the Z direction between the tip of the nozzle N and the tip of the part P is stored.

[Variation Information]

FIG. 13 shows an example of a variation information table which is an embodiment of the variation information D4. The variation information table includes fields such as feeder number (13a), adsorption nozzle number (13b), pre-modification part holding position variance VarXY(B) (13c), pre-modification distance variance VarZ(B) (13d), pre-modification number of data M(B) (13e), post-modification part holding position variance VarXY (A) (13f), pre-modification distance variance VarZ(A) (13g), and post-modification number of data M(A) (13h). Information calculated in the processing shown in FIG. 9 is stored in the variation information D4.

Information of the position of the feeder F is stored in the feeder number 13a (in the same way as 10c). Information of the position of the nozzle N is stored in the adsorption nozzle number 13b (in the same way as 10d).

Information of a variance value (denoted by VarXY(B)) calculated from the part holding positions HX (12f) and HY (12g) before the operation information modification is stored in the pre-modification part holding position variance VarXY(B) (13c). Information of a variance value (denoted by VarZ(B)) calculated from the distance KZ (12h) before the operation information modification is stored in the pre-modification distance variation VarZ(B) (13d). These variance values (VarXY, VarZ) represent the degrees of variations. By the way, variance of each of 13c and 13d is obtained for a unit (combination) of the feeder F, the part P, and the nozzle N. (Variance may be obtained for the same feeder F irrespective of the feeder F. Furthermore, variance for the same nozzle N may be obtained irrespective of the feeder F.) Furthermore, variance based on actual result data of mounting operations a plurality of times in the past is obtained.

Information of the number of data in the part holding positions HX and HY and the distance KZ used to calculate VarXY(B) and VarZ(B) is stored in the pre-modification number of data M(B) (13e).

Information of a variance value (denoted by VarXY(A)) calculated from the part holding positions HX (12f) and HY (12g) after the operation information modification is stored in the post-modification part holding position variance VarXY(A) (13f). Information of a variance value (denoted by VarZ(A)) calculated from the distance KZ (12h) after the operation information modification is stored the post-modification distance variance VarZ(A) (13g). These variances (VarXY and VarZ) represent the degree of variation. By the way, variance of each of 13f and 13g is obtained for a unit (combination) of the feeder F, the part P, and the nozzle N. (Variance may be obtained for the same feeder F irrespective of the feeder F. Furthermore, variance for the same nozzle N may be obtained irrespective of the feeder F.) Furthermore, variance based on actual result data of mounting operations a plurality of times in the past is obtained.

Information of the number of data in the part holding positions HX and HY and the distance KZ used to calculate VarXY(A) and VarZ(A) is stored in the post-modification number of data M(A) (13h).

[Threshold Information]

FIG. 14 shows an example of a threshold information table which is an embodiment of the threshold information D5. The threshold information table includes fields such as execution determination threshold Th1 (14a), effect determination threshold (the number of data 20) ThE20 (14b), effect determination threshold (the number of data 40) ThE40 (14c), and effect determination threshold (the number of data 60) ThE60 (14d). The threshold information D5 is setting information used in determination (s203 and s210) relating to modification of the operation of the nozzle N at the time of adsorption. Each field value can be changed in setting by the user.

Information for determining (s203) whether to execute modification processing on the position (z) in the Z direction of the nozzle N, the stop time (T), the operation velocity (VZ) and the like is stored in the execution determination threshold Th1 (14a).

Information for determining whether modification of the operation information has brought about a variation reduction effect is stored in the effect determination threshold (the number of data 20) ThE20 (14b), the effect determination threshold (the number of data 40) ThE40 (14c), and the effect determination threshold (the number of data 60) ThE60 (14d). If the number of data M(B) (13e) used to calculate the variance before modification of the operation information is at least 20 and less than 40, the effect determination threshold (the number of data 20) ThE20 (14b) is utilized. If the number of data M(B) (13e) used to calculate the variance before modification of the operation information is at least 40 and less than 60, the effect determination threshold (the number of data 40) ThE40 (14c) is utilized. If the number of data M(B) (13e) used to calculate the variance before modification of the operation information is at least 60, the effect determination threshold (the number of data 60) ThE60 (14d) is utilized. If the value of the number of data M(B) becomes large, the value of the threshold for effect determination becomes small. This represents that in a case where the number of data is large it is determined that there is a variation reduction effect even if the difference in magnitude of variation between before the operation modification and after the operation modification is small. By the way, in the present embodiment, the number of data before the operation modification M(B) is used to change over the utilized threshold. In a case where the number of data after the operation modification M(A) is used, however, it is also possible to set a threshold that becomes small in value if the number of data M(A) becomes large, in the same way.

[Reduction Effect Information]

FIG. 15 shows an example of a reduction effect information table which is an embodiment of the reduction effect information D6. The reduction effect information table includes fields such as stop position (Z) effect (15a), stop time (T) effect (15b), and operation velocity (VZ) effect 15c. Information utilized for determination in the processing shown in FIG. 9 is stored in the reduction effect information D6.

Information indicating whether there is a variation reduction effect in the modification of the stop position (Z), which is one of the operation information, is stored in the stop position (Z) effect (15a). Information indicating whether there is a variation reduction effect in the modification of the stop time (T), which is one of the operation information, is stored in the stop time (T) effect (15b). Information indicating whether there is a variation reduction effect (effectiveness to variation reduction) in the modification of the operation velocity (VZ), which is one of the operation information, is stored in the operation velocity (VZ) effect (15c).

For example, in a case where the mounting device is started, "–" is stored in each field of the reduction effect information D6 as an initial value to indicate that determination as to whether there is an effect is not yet executed. As a result of the processing shown in FIG. 9, a value in each field of the reduction effect information D6 is modified to "O" to indicate that there is a reduction effect or "X" to indicate that there is not a reduction effect.

[Cycle Change Quantity Information]

FIG. 16 shows an example of a cycle change quantity information table which is an embodiment of the cycle change quantity information D7. The cycle change quantity information table includes fields such as stop position (Z) cycle change quantity (16a), stop time (T) cycle change quantity (16b), and operation velocity (VZ) cycle change quantity (16c). Values are stored in the cycle change quantity information D7 by the processing shown in FIG. 9. The stored values are utilized for determination in the processing shown in FIG. 9.

Information indicating a cycle time increase quantity per adsorption operation at the time when the stop position (Z), which is one of operation information, is modified is stored in the stop position (Z) cycle change quantity (16a). Information indicating a cycle time increase quantity per adsorption operation at the time when the stop time (T), which is one of operation information, is modified is stored in the stop time (T) cycle change quantity (16b). Information indicating a cycle time increase quantity per adsorption operation at the time when the operation velocity (VZ), which is one of operation information, is modified is stored.

As for the cycle time increase quantity in each field, plus indicates an increase and minus indicates a decrease. In the present embodiment, information indicating a cycle time increase quantity per adsorption operation is stored. However, information indicating a cycle time increase quantity per produced substrate may be stored.

[Details of Processing (FIG. 9)]

FIG. 9 shows an example of processing, concerning S109 in FIG. 2, conducted by the arithmetic device 150 (mainly the arithmetic control unit 160) to calculate and modify the operation information D2 (s201 and the like represent processing steps). Upon receiving information specifying a combination of the feeder F (feeder position) (d201) and the nozzle N (nozzle position) (d202), which becomes a target of modification of the operation information D2 (table) and an instruction of modification processing of the operation information D2, from, for example, the general control device 140 (the general control unit 144) via the IF unit 163 and the like, the arithmetic control unit 160 executes the processing shown in FIG. 9.

(s201)

The arithmetic control unit 160 calculates an average value (AveX) of the part holding position HX, an average value (AveY) of the part holding position HY, and an average value (AveZ) of the distance KZ. By the way, an average (Ave) in a unit such as the feeder F, the nozzle N, and the part P is obtained.

First, the arithmetic control unit 160 identifies a row having a feeder number (11a) equal to d201 and an adsorption nozzle number (11b) equal to d202 in the table of the operation information D2, and reads the stop position (Z) (11c) (MIold1), the stop time (T) (11d) (MIold2), and the operation velocity (VZ) (11e) (MIold3) stored in the row. In addition, the arithmetic control unit 160 conducts retrieval in all rows in the table of the adsorption result information D3, identifies a row satisfying the following condition 1, and reads information of the part holding positions HX (12f) and HY (12g) and the distance KZ (12h) in the row satisfying the condition 1.

(Condition 1)

A value stored in the feeder number 12a is equal to d201, a value stored in the adsorption nozzle number 12b is equal to d202, a value stored in the stop position (z) is equal to MIold1, a value stored in the stop time (T) is equal to MIold2, and a value stored in the operation velocity (VZ) is equal to MIold3.

Here, in an ith row from the top among rows satisfying the condition 1, information of the part holding position HX (12f) is referred to as Xi, information of the part holding position HY (12g) is referred to as Yi, and information of the distance KZ (12h) is referred to as Zi. The number of rows satisfying the condition 1 is referred to as n.

In addition, the arithmetic control unit 160 calculates the average value (AveX) of the part holding position HX, the average value (AveY) of the part holding position HY, and the average value (AveZ) of the distance KZ. In a case where the number n of data is a predetermined threshold Th0 (for example, 20) or less, the number of data is determined to be small and the processing proceeds to next S202. In a case where n is larger than Th0, the arithmetic control unit 160 calculates AveX, AveY and AveZ in accordance with the following Expression (1), Expression (2) and Expression (3).

[MATH. 1]
$$AveX = \left(\sum_{i=1}^{n} X_i\right)/n \quad (1)$$

[MATH. 2]
$$AveY = \left(\sum_{i=1}^{n} Y_i\right)/n \quad (2)$$

[MATH. 3]
$$AveZ = \left(\sum_{i=1}^{n} Z_i\right)/n \quad (3)$$

(S202)

In a case where the number n of data is a predetermined threshold Th0 (for example, 20) or less, the arithmetic control unit 160 determines the number of data to be small and finishes the processing. In a case where n is larger than Th0, the arithmetic control unit 160 proceeds to next S203.

(s203)

The arithmetic control unit 160 calculates variance (VarXY) of HX and HY as a value indicating variation of the part holding positions HX and HY. The arithmetic control unit 160 calculates variance (VarZ) of KZ as a value indicating variation of the distance KZ. The arithmetic control unit 160 calculates VarXY and VarZ in accordance with the following Expression (4) and Expression (5).

[MATH. 4]
$$VarXY = \left(\sum_{i=1}^{n} \{(X_i - AveX)^2 + (Y_i - AveY)^2\}\right)/(n-1) \quad (4)$$

[MATH. 5]
$$VarZ = \left(\sum_{i=1}^{n} \{Z_i - AveZ\}\right)/(n-1) \quad (5)$$

The information control unit 160 stores the above-described VarXY into 13c in the table of variation information D4 and stores VarZ into 13d. Furthermore, the information control unit 160 stores the number n of data into 13e in the table of the variation information D4.

(s204)

The arithmetic control unit 160 makes a decision for determining processing to be conducted subsequently by using data of variation (variance VarXY) of HX and HY and variation (variance VarZ) of the distance KZ calculated at s203 and an execution determination threshold Th1 (14a) of the threshold information D5. In a case where VarXY or VarZ is larger than the execution determination threshold Th1 (14a), the arithmetic control unit conducts processing at s205 and subsequent steps. In a case where both VarXY and VarZ are the execution determination threshold Th1 (14a) or less, the arithmetic control unit determines that variation reduction is not necessary and finishes the processing.

(s205)

The arithmetic control unit 160 makes a decision for determining processing to be conducted subsequently by using the reduction effect information D6. In a case where X indicating no effect is stored in all fields (15a, 15b and 15c) in the table of the reduction effect information D6, the arithmetic control unit 160 regards a variation reduction effect as unexpected even if any operation information is changed and finishes the processing. In a case where "O" indicating that there is an effect or "−" indicating that effect determination is not yet executed is stored in some field, the arithmetic control unit 160 executes processing at s206 and subsequent steps. In the processing at s206 and subsequent steps, the stop position Z, the stop time T, or the operation velocity VZ of the nozzle N is modified.

(s206)

The arithmetic control unit 160 calculates a change quantity of the cycle time in a case where each kind of operation information is changed, and updates the cycle change information D7. The arithmetic control unit 160 calculates the cycle time change quantity in the case where each kind of operation information is changed by using IV1 (indicating a modification quantity of the stop position (Z)), IV2 (indicating a modification quantity of the stop time (T)) and IV3 (indicating a modification quantity of the operation velocity (VZ)), which are modification quantities of the operation information set by the user, in accordance with the following Expression (6), Expression (7) and Expression (8). In the present embodiment, IV1=0.1, IV2=0.5 and IV3=−0.1.

[MATH. 6]

$$TC1 = IV1/MIold1 \quad (6)$$

[MATH. 7]

$$TC2 = IV2 \quad (7)$$

[MATH. 8]

$$TC3 = (LZ + MIold1)/\{VMax \times (MIold3 + IV3)\} - (LZ + MIold1)/(VMax \times MIold3) \quad (8)$$

In Expression (6), Expression (7), and Expression (8), TC1 indicates a change quantity of the cycle time caused by modification of the stop position (Z), TC2 indicates a change quantity of the cycle time caused by modification of the stop time (T), and TC3 indicates a change quantity of the cycle time caused by modification of the operation velocity (VZ). VMax indicates a maximum value of the operation velocity.

In addition, the arithmetic control unit 160 stores TC1 into 16*a*, TC2 into 16*b*, and TC3 into 16*c*.

(s207)

The arithmetic control unit 160 identifies operation information to be modified, by using the reduction effect information D6 and the cycle change quantity information D7. The arithmetic control unit 160 selects one of the stop position (Z), the stop time (T), and the operation velocity (VZ) that has O or − in the corresponding one of the fields 15*a*, 15*b* and 15*c* of the reduction effect information and that has a minimum value in the corresponding one of the fields 15*a*, 16*b* and 16*c* of the cycle change quantity information, as the operation information to be modified. In the example shown in FIG. 16 and FIG. 17, the operation velocity (T) is selected.

(s208)

The arithmetic control unit 160 calculates a modified value of the operation information. The arithmetic control unit 160 calculates the operation information selected at s207 by using the following Expression (9). MInewi represents a modified value of each kind of operation information. In Expression (9), 1 is input to i in a case where the stop position (Z) is selected, 2 is input to i in a case where the stop time (T) is selected, and 3 is input to i in a case where the operation velocity (VZ) is selected.

[MATH. 9]

$$MInewi = MIoldi + IVi \quad (9)$$

By the way, the modification method may be multiplication or the like instead of the addition.

(s209)

The arithmetic control unit 160 conducts part adsorption and measurement of the part holding position by using the modified value of the operation information. The arithmetic control unit 160 uses setting values obtained by setting the operation information selected at s207 to MInewi and setting operation information that is not selected at s207 to MIoldi, conducts adsorption operation from the feeder in d201 with the nozzle in d202, and measures the part holding positions HX and HY and the distance KZ. The present operation is processing similar to the measurement operation in a102, s103, s104, s105 and s106. The arithmetic control unit 160 creates adsorption result information 152 which becomes actual result data from measured results and stores the adsorption result information 152 into the storage unit 151 in the arithmetic device 150. The adsorption result information 152 includes information of the distance KZ and the part holding positions HX and HY. By the way, this storage may be conducted at other timing. The adsorption operation and the measurement operation are executed a predetermined number of times (twenty times in the present embodiment). By the way, in the present embodiment, the part adsorbed here is discarded. The part may be mounted on the substrate or may be withdrawn.

(s210)

The arithmetic control unit 160 calculates the variance VarXY of the part holding position and the variance VarZ of the distance in the setting values after the operation information modification. Processing conducted here is processing similar to that at s201 and s203.

The arithmetic control unit 160 conducts retrieval in all rows in the table of the adsorption result information D3, identifies a row satisfying the following condition 1, and reads information of the part holding positions HX (12*f*) and HY (12*g*) and the distance KZ (12*h*) in the row satisfying the condition 2.

(Condition 2)

A value stored in the feeder number 12*a* is equal to d201, a value stored in the adsorption nozzle number 12*b* is equal to d202, a value stored in the stop position (z) is equal to MIold1 (MInew1 in the case where the stop position (z) is selected at s207), a value stored in the stop time (T) is equal to MIold2 (MInew2 in the case where the stop position (z) is selected at s207), and a value stored in the operation velocity (VZ) is equal to MIold3 (MInew3 in the case where the stop position (z) is selected at s207).

Here, in an ith row from the top among rows satisfying the condition 2, information of the part holding position HX (12*f*) is referred to as Xi, information of the part holding position HY (12*g*) is referred to as Yi, and information of the distance KZ (12*h*) is referred to as Zi. Values of Xi, Yi and Zi are updated. Furthermore, the number of data satisfying the condition 2 is referred to as n. The value of n is updated.

The arithmetic control unit 160 calculates the average value (AveX) of the part holding position HX, the average value (AveY) of the part holding position HY, and the average value (AveZ) of the distance KZ. The arithmetic control unit 160 calculates AveX, AveY and AveZ in accordance with Expression (1), Expression (2) and Expression (3).

In addition, the arithmetic control unit 160 calculates variance (VarXY) of HX and HY as a value indicating variation of the part holding positions HX and HY in accordance with Expression (4), and calculates variance (VarZ) of KZ as a value indicating variation of the distance KZ in accordance with Expression (5).

The arithmetic control unit 160 stores VarXY described above into 13f in the table of the variation information D4, and stores VarZ into 13g. Furthermore, the arithmetic control unit 160 stores the number n of data into 13h in the table of the variation information D4.

(s211)

The arithmetic control unit 160 determines whether the modification of the operation information selected at s207 has brought about a variation reduction effect, by using the following Expression (10).

[MATH. 10]

$$\text{Var}B/\text{Var}A > \text{ThE} \quad (10)$$

In Expression (10), information stored in 13c or 13d is input to VarB, and information stored in 13f or 13g is input to VarA. If the number M(B) (13e) of data used to calculate the variance before modification of the operation information is at least 20 and less than 40, 14b is input to ThE. If the number M(B) (13e) of data is at least 40 and less than 60, 14c is input to ThE. If the number M(B) (13e) of data is at least 60, 14d is input to ThE. In a case where Expression (10) is satisfied in the combination of 13c and 13f or in the combination of 13d and 13g, the arithmetic device 160 determines that there is a variation reduction effect. In a case where Expression (10) is not satisfied in any combination, the arithmetic device 160 determines that there is not a variation reduction effect. In a case where it is determined that there is a variation reduction effect, the arithmetic device 160 updates one of the fields 15a, 15b and 15c in the reduction effect information D6 corresponding to the operation information selected at s207 to O which indicates that there is an effect. In a case where it is determined that there is not a variation reduction effect, the arithmetic device 160 updates one of the fields 15a, 15b and 15c in the reduction effect information D6 corresponding to the operation information selected at s207 to X which indicates that there is not an effect. Fields that are included in the fields 15a, 15b and 15c in the reduction effect information D6, that do not correspond to the operation information selected at s207, and that store O, which indicates that there is an effect, are updated to –, which indicates that determination as to whether there is an effect is not yet executed.

The reason why it is determined whether there is a variation reduction effect is to prevent the cycle time from being lowered by changing operation information that does not bring about a variation reduction effect.

(s212)

In a case where it is determined at s211 that there is a variation reduction effect, the arithmetic control unit 160 then executes processing at s213. In a case where it is determined at s211 that there is not a variation reduction effect, the arithmetic control unit 160 conducts the processing at s205 again.

(s213)

The arithmetic control unit 160 outputs information (modification contents information), such as the modified value of the Z direction position (z), the modified value of the stop time T, and the modified value of the operation velocity VZ, on the basis of the result of processing conducted as far as s10. In the present embodiment, processing of displaying the modification contents information on the screen is conducted, and it is made possible for the user to confirm modification contents and execute modification (FIG. 17). The screen is displayed in the output device 171 in the parts mounting device 100 (or the output unit 162 in the arithmetic device 150).

FIG. 17 shows an example of the screen displayed at s213. The present screen displays a number of the feeder F (g11) and a number of the nozzle N (g12) that become a modification target, the variation (variance value) of the part holding position HX and HY (g13) and variation (variance value) of the distance KZ (g14) before operation information modification, the operation information D2 before modification (such as the stop position (Z) (g15), the stop time (T) (g16), and the operation velocity (VZ) (g17)), the operation information D2 after modification (such as the stop position (Z) (g18), the stop time (T) (g19), and the operation velocity (VZ) (g20)), a change quantity of variation of the part holding positions HX and HY (g21), a change quantity of variation of the distance KZ (g22), and a change quantity of cycle time (g23) caused by modification of the operation information, information as to whether there is a variation reduction effect brought about by modification of the stop position (Z) (g24), whether there is a variation reduction effect brought about by modification of the stop time (T) (g25), and whether there is a variation reduction effect brought about by modification of the operation velocity (VZ) (g26), and buttons for specifying whether to execute modification (g27 and g28).

The arithmetic device 160 displays d201 in g11, d202 in g12, 13c in g13, and 13d in g14. The arithmetic device 160 displays MIold1 in g15 before modification, MIold2 in g16 before modification, and MIold3 in g17 before modification. In a case where 15a is O, the arithmetic device 160 displays MInew1 in g18 after modification. In a case where 15a is X or –, the arithmetic device 160 displays MIold1 in g18 after modification. In a case where 15b is O, the arithmetic device 160 displays MInew2 in g19 after modification. In a case where 15b is X or –, the arithmetic device 160 displays MIold2 in g19 after modification. In a case where 15c is O, the arithmetic device 160 displays MInew3 in g20 after modification. In a case where 15c is X or –, the arithmetic device 160 displays MIold3 in g20 after modification. The arithmetic device 160 displays a value obtained by dividing 13f by 13c in g21 in the change by modification, and a value obtained by dividing 13g by 13d in g22 in the change by modification. In a case where O is stored in 15a, the arithmetic device 160 displays 16a in g23 in the change by modification. In a case where O is stored in 15b, the arithmetic device 160 displays 16b in g23 in the change by modification. In a case where O is stored in 15c, the arithmetic device 160 displays 16c in g23 in the change by modification. The arithmetic device 160 displays 15a in g24 in modification effect, 15b in g25 in modification effect, and 16c in g26 in modification effect.

(s214)

The arithmetic control unit 160 accepts a result of user's input (for example, "execute modification" using "Yes" button) at s213 (the screen in FIG. 17). In the case of "execute modification" (Yes) (Y), the arithmetic control unit 160 conducts processing of s215. In the case of "don't execute modification" (No), the arithmetic control unit 160 does not conduct processing of s215 and finishes. By the way, it is also possible to omit s213 and s214 and execute the modification at s215 automatically as described earlier (for example, it is made possible to previously set automatic execution).

(s215)

The arithmetic control unit 160 modifies the operation information D2 (such as Z, T and VZ) by using the above-described processing result (modification contents information). For example, the arithmetic control unit 160 identifies a row in the table of the operation information D2 that is equal in stored value in the feeder number 11a to d201 and equal in stored value in the adsorption nozzle number 11b to d202. In a case where 15a is O, the arithmetic control unit 160 modifies data in the stop position (Z) in 11c in the row to MInew1. In a case where 15b is O, the arithmetic control unit 160 modifies data in the stop time T (11d) in the row to MInew2. In a case where 15c is O, the arithmetic control unit 160 modifies data in the operation velocity VZ (11e) in the row to MInew3. Then, the arithmetic control unit 160 finishes the processing.

By the way, it is also possible to set a parameter (AZ) that controls acceleration (operation acceleration) of the nozzle rising in the Z direction at s105 and reduce the parameter (AZ) instead of the operation velocity VZ or together with the operation velocity VZ in the processing in FIG. 9.

Furthermore, in a case where an adsorption abnormality occurs even if the stop position (Z), the stop time (T), the operation velocity (VZ), or the operation acceleration (AZ) is modified in the processing shown in FIG. 9, the processing shown in FIG. 9 is executed again and the stop position (Z), the stop time (T), the operation velocity (VZ), or the operation acceleration (AZ) is further modified.

[Effects and the Like]

Figure 18:
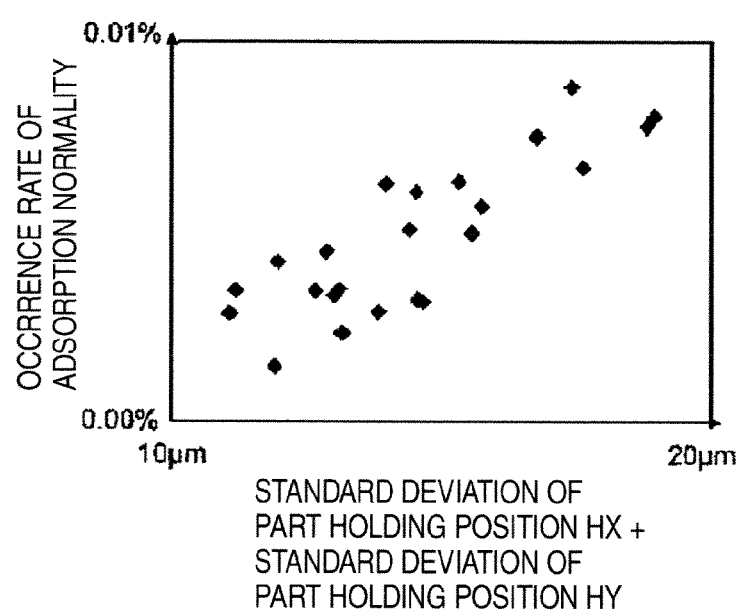
FIG. 18 is a diagram showing relations between the occurrence rate of adsorption abnormalities and the standard deviation of the part holding position.

A plurality of adsorption operations conducted during a determinate time is regarded as one set. A ratio of occurrence of adsorption abnormality in the set (occurrence rate of adsorption abnormality) and standard deviation of the part holding position in the adsorption operation will be considered. In a plurality of sets, the occurrence rate of adsorption abnormality and standard deviation of the part holding position are calculated. The standard deviation of the part holding position is represented as a value on the X axis, and the occurrence rate of adsorption abnormality is represented as a value on the Y axis. A graph as shown in FIG. 18 is obtained by plotting respective sets on the XY plane. If the standard deviation of the part holding position is small, the occurrence rate of adsorption abnormality is also small as appreciated from the graph shown in FIG. 18, In the parts mounting device 100 (the arithmetic device 150) in the present embodiment, therefore, the part holding position HX and HY of the nozzle N after adsorption of the part P and the Z-direction position (z) of the nozzle N at the time of adsorption based on actual result data (the adsorption result information D3) are used as input information, and the stop position (Z), the stop time (T), the operation velocity (VZ) and the like are suitably calculated and modified as described heretofore. As a result, the standard deviation of the part holding position can be reduced while suppressing the increase of the cycle time. Accordingly, the occurrence rate of the adsorption abnormality can be reduced.

The embodiment has been described by taking a nozzle as an example of the part holding member which takes out and hold a part. However, the present invention can also be applied to a case where a chuck which sandwiches and takes out a part is used besides the nozzle, Heretofore, the invention made by the present inventor has been described specifically on the basis of embodiments. However, the present invention is not restricted to the embodiments. It is a matter of course that various changes can be made without departing from the spirit of the present invention.

REFERENCE SIGNS LIST

50: Part (P)
90: Substrate
100: Parts mounting device
110: Supply device
111: Feeder base
111a: Feeder (F)
112, 125, 133, 145, 163: IF unit
120: Attachment device
121: Head
122: Beam
122a: Guide
123: Nozzle (adsorption nozzle) (N)
124: Drive control unit
125: Pressure control unit
130: Part detection device
131: Side face detection unit
132: Bottom face detection unit
140: General control device
141: Storage unit
144: General control unit
150: Arithmetic device
151: Storage unit
D1: Attachment information
D2: Operation information
D3: Adsorption result information
D4: Variation information
D5: Threshold information
160: Arithmetic control unit
161: Input unit
162: Output unit
170: Input device
171: Output device
172: Communication IF device
173: Bus

The invention claimed is:

1. An arithmetic device which calculates setting of operation control in a parts mounting device which mounts a part on a substrate,
   the parts mounting device including a supply device which supplies the part; an attachment device including a part holding member to take out and hold the part; a general control device which controls operations of respective regions including the supply device and the attachment device in a mounting operation including an operation of taking out and holding the part by using the part holding member in accordance with information of the setting and an attachment operation of attaching the part taken out and held by the part holding member to a substrate; and a detection device which detects a state concerning the part holding member and the part at time of the operation of taking out and holding the part,
   the arithmetic device comprising: an arithmetic control unit which conducts calculation processing; and a storage unit which stores data information to be used in the calculation processing,
   the arithmetic control unit conducting
   (1) first processing of acquiring or calculating a state parameter which represents a distance between the part holding member and the part or relative positions at the time of operation of taking out and holding the part, by using the detection device and storing information thereof into the storage unit, (2) second processing of calculating a variation value of the stored state parameter in the operation of taking out and holding the part and storing information thereof into the storage unit, and (3) when the variation value of the state parameter exceeds a first threshold, third processing of selecting a parameter value to be modified, out of parameter values representing a holding position, stop time, an operation velocity, and operation acceleration, on the basis of information of effectiveness to variation reduction of the state parameter when modified and an increase quantity of time required for substrate production when modified, and conducting modification.

2. The arithmetic device according to claim 1, wherein in the third processing,
in a case where a difference between a variation value of the state parameter before modification of the parameter value and a variation value of the state parameter after the modification of the parameter value exceeds a second threshold, the parameter value is determined to be a parameter value that is effective to variation reduction.

3. The arithmetic device according to claim 2, wherein the second threshold used to calculate the variation value in a case where the number of data is large is made smaller in value than the second threshold used in a case where the number of data is small.

4. The arithmetic device according to claim 1, wherein a variance value is calculated as the variation value of the state parameter, and the variance value is utilized.

5. The arithmetic device according to claim 1, wherein the variation value of the state parameter and modification contents information including values before and after the modification concerning the parameter in the setting are displayed on an output device included in the parts mounting device or the arithmetic device, and the modification is executed after user's confirmation.

6. A parts mounting device which mounts a part on a substrate,
the parts mounting device including a supply device which supplies the part; an attachment device including a part holding member to take out and hold the part; a general control device which controls operations of respective regions including the supply device and the attachment device in a mounting operation including an operation of taking out and holding the part by using the part holding member in accordance with information of the setting and an attachment operation of attaching the part taken out and held by the part holding member to a substrate; a detection device which detects a state concerning the part holding member and the part at time of the operation of taking out and holding the part; and an arithmetic device which calculates setting of operation control in the parts mounting device,
the arithmetic device including: an arithmetic control unit which conducts calculation processing; and a storage unit which stores data information to be used in the calculation processing,
the arithmetic control unit conducting (1) first processing of acquiring or calculating a state parameter which represents a distance between the part holding member and the part or relative positions at the time of operation of taking out and holding the part, by using the detection device and storing information thereof into the storage unit, (2) second processing of calculating a variation value of the stored state parameter in the operation of taking out and holding the part and storing information thereof into the storage unit, and (3) when the variation value of the state parameter exceeds a first threshold, third processing of selecting a parameter value to be modified, out of parameter values representing a holding position, stop time, an operation velocity, and operation acceleration, on the basis of information of effectiveness to variation reduction of the state parameter when modified and an increase quantity of time required for substrate production when modified, and conducting modification.

7. The parts mounting device according to claim 6, wherein
in the third processing, in a case where a difference between a variation value of the state parameter before modification of the parameter value and a variation value of the state parameter after the modification of the parameter value exceeds a second threshold, the parameter value is determined to be a parameter value that is effective to variation reduction.

8. The parts mounting device according to claim 7, wherein
the second threshold used to calculate the variation value in a case where the number of data is large is made smaller in value than the second threshold used in a case where the number of data is small.

9. The parts mounting device according to claim 6, wherein
a variance value is calculated as the variation value of the state parameter, and the variance value is utilized.

10. The parts mounting device according to claim 6, wherein
the variation value of the state parameter and modification contents information including values before and after the modification concerning the parameter in the setting are displayed on an output device included in the parts mounting device or the arithmetic device, and the modification is executed after user's confirmation.

11. A computer program product stored on a non-transitory computer readable medium which causes an arithmetic device to execute information processing of calculating setting of operation control in a parts mounting device which mounts a part on a substrate,
the parts mounting device including a supply device which supplies the part; an attachment device including a part holding member to take out and hold the part; a general control device which controls operations of respective regions including the supply device and the attachment device in a mounting operation including an operation of taking out and holding the part by using the part holding member in accordance with information of the setting and an attachment operation of attaching the part taken out and held by the part holding member to a substrate; and a detection device which detects a state concerning the part holding member and the part at time of the operation of taking out and holding the part,
the arithmetic device including: an arithmetic control unit which conducts calculation processing, and a storage unit which stores data information to be used in the calculation processing,
as processing of executing on the basis of the program, the arithmetic control unit conducting (1) first processing of acquiring or calculating a state parameter which represents a distance between the part holding member and the part or relative positions at the time of operation of taking out and holding the part, by using the detection device and storing information thereof into the storage unit, (2) second processing of calculating a variation value of the stored state parameter in the operation of taking out and holding the part and storing information thereof into the storage unit, and (3) when the variation value of the state parameter exceeds a first threshold, third processing of selecting a parameter value to be modified, out of parameter values representing a holding position, stop time, an operation velocity, and operation acceleration, on the basis of information of effectiveness to variation reduction of the state parameter when modified and an increase quantity of time required for substrate production when modified, and conducting modification.

12. The computer program product according to claim 11, wherein in the third processing, in a case where a difference between a variation value of the state parameter before modification of the parameter value and a variation value of the state parameter after the modification of the parameter value exceeds a second threshold, the parameter value is determined to be a parameter value that is effective to variation reduction.

13. The computer program product according to claim 12, wherein the second threshold used to calculate the variation value in a case where the number of data is large is made smaller in value than the second threshold used in a case where the number of data is small.

14. The computer program product according to claim 11, wherein a variance value is calculated as the variation value of the state parameter, and the variance value is utilized.

15. The computer program product according to claim 11, wherein the variation value of the state parameter and modification contents information including values before and after the modification concerning the parameter in the setting are displayed on an output device included in the parts mounting device or the arithmetic device, and the modification is executed after user's confirmation.

\* \* \* \* \*